United States Patent [19]

Brandes

[11] Patent Number: 4,695,798
[45] Date of Patent: Sep. 22, 1987

[54] METHOD AND APPARATUS FOR GENERATING FREQUENCY SELECTIVE PULSES FOR NMR SPECTROSCOPY

[75] Inventor: Rolf Brandes, Stockholm, Sweden
[73] Assignee: The Regents of the University of California, Berkeley, Calif.
[21] Appl. No.: 725,382
[22] Filed: Apr. 22, 1985
[51] Int. Cl.$^4$ ........................................... G01R 33/20
[52] U.S. Cl. .................................. 324/307; 328/187; 375/3
[58] Field of Search ................. 332/9 R, 41; 307/261, 307/529; 328/16, 187; 324/307, 309, 310, 311, 312, 313, 314, 318, 322; 375/3, 16; 455/108

[56] References Cited

U.S. PATENT DOCUMENTS

| | | | |
|---|---|---|---|
| 3,350,651 | 10/1967 | Davis | 328/16 |
| 3,478,280 | 11/1969 | Fenner | 332/9 R |
| 3,909,563 | 9/1975 | Ghosh | 375/3 |
| 3,909,705 | 9/1975 | Tschopp | 324/0.5 R |
| 3,968,424 | 7/1976 | Ernst | 324/0.5 AC |
| 4,034,191 | 7/1977 | Tomlinson et al. | 235/151.3 |
| 4,063,199 | 12/1977 | Oursler, Jr. | 332/41 |
| 4,065,714 | 12/1977 | Hill | 324/0.5 A |
| 4,171,511 | 10/1979 | Hill | 324/313 |
| 4,258,436 | 3/1981 | Campbell | 332/9 R |
| 4,345,207 | 8/1982 | Bertrand et al. | 324/308 |

Primary Examiner—Michael J. Tokar
Attorney, Agent, or Firm—Brown, Martin, Haller & Meador

[57] ABSTRACT

A method and apparatus for generating a frequency selective output pulse from a carrier frequency signal pulse of a predetermined duration. Included are pulse means for generating at least one modulating pulse of predetermined amplitude, duration, and frequency content; filter means responsive to said modulating pulse for removing selected frequencies from the frequency content of said modulating pulse, said filter means having a predetermined transfer function so as to provide a modulating signal varying in amplitude as a function of time; and modulator means responsive to a carrier frequency signal pulse and said modulating signal for modulating the amplitude of the carrier frequency signal pulse and providing a frequency selective output pulse having a predetermined frequency content centered about the carrier frequency in the carrier frequency signal pulse.

29 Claims, 19 Drawing Figures

METHOD AND APPARATUS FOR GENERATING FREQUENCY SELECTIVE PULSES FOR NMR SPECTROSCOPY

FIELD OF THE INVENTION

The present invention relates to an apparatus and method for generating frequency selective pulses. More specifically, the present invention relates to a novel apparatus and method for generating a radio frequency (rf) pulse modulated by predetermined functions so as to provide selective excitation of a spectrum of resonance lines.

BACKGROUND OF THE INVENTION

Many NMR experiments require frequency selective radio frequency (rf) pulses and a variety of schemes have been developed for this purpose. Most of the commonly used methods involve controlling pulse widths and interpulse delay times between a collection of constant amplitude rectangular rf pulses. For example, the soft pulse and the Dante pulse scheme have been used to selectively suppress intense solvent peaks and to obtain the spectra of solutes dissolved in water.

In experiments where selective excitation of resonances located in a narrow range of the spectrum is required, the soft pulse and the Dante pulse schemes have again been used. However, in both cases there are undesirable features arising from lobes that are present on either side of the central excitation frequency. These lobes may result in the excitation of undesired resonances. While these excitations of undesired resonances are not large for small tip angles, they are quite severe for larger tip angles such as 90°.

The soft pulse is generated by using a relatively long, low amplitude pulse (as compared to the short, high-amplitude pulse used to generate a hard pulse) to gate on/off an rf carrier. The resulting soft pulse has the Fourier spectrum of the sinc function. Methods used in generating the hard and soft pulse have the virtue that they only involve relatively simple on-off gating of the rf carrier at a predetermined amplitude during the pulse duration.

However, it is known that improved selectivity in frequency excitation results when the excitation pulse is modulated by a frequency function of the sinc or Gaussian form. This required more complex circuitry to develop the modulator of these functions on a carrier frequency.

One such solution to the problem of generating a selective rf pulse is to use a computer to control the time-dependent amplitude of an rf pulse or collection of pulses in a manner that leads to the appropriate distribution in frequency. In this approach, the Fourier transform of the desired rf spectral distribution is calculated, stored in a computer memory, and then fed into a mixer to modulate the amplitude of the carrier frequency with the calculated time dependent function. In addition, predetermined correction factors are used to modify the calculated functions stored in the computer memory so as to correct for nonlinearities in the rf mixers and amplifiers. By computing the appropriate functional form, which is then stored in the computer, any excitation pattern could in principle be devised.

This is strictly true only for small tip angles of the magnetization vector, since the spin system then responds linearly to the excitation pulse.

One example of a computer-controlled method in generating rf excitation signals that have the exact spectral characteristics is by amplitude and frequency modulation of the rf carrier. This technique uses modulating functions generated by synthesizers and waveform generators. A disadvantage to this technique is that additional equipment not usually found on commercial spectrometers is required.

It is, therefore, an object of the invention to provide a new and improved apparatus and method for generating modulating functions for a pulsed rf carrier.

It is yet another object of the present invention to use defined filter functions of relatively inexpensive filters, instead of a computer to generate the rf carrier modulating function.

SUMMARY

The present invention discloses an apparatus and method for generating tailored excitation pulses that can be implemented without using computer-synthesized modulating pulses. The present invention is based on the premise that a tailored rf pulse with the requisite frequency distribution can be obtained by mixing an rf carrier of single frequency with an low frequency signal (such a in audio frequency range) of a predetermined frequency content. In the present invention the problem of tailoring an excitation pulse is reduced to generating the audio signal with the desired frequency distribution. In the present invention, an audio signal with the desired frequency distribution is generated by passing a broadband audio signal through an audio filter or a bank of filters with the desired frequency response.

Summarizing, a pulse generator provides a short DC pulse, of length $t_a$, so as to generate a broadband audio signal that contains a range of frequencies centered about $=0$ in the frequency domain and extending over a range of $\sim(0.26\ t_a)^{-1}$ with moderate amplitude (half height). This broadband audio signal is then shaped by passing it through the audio filters to remove all unwanted frequencies. The filtered signal is then mixed with an rf carrier pulse to generate an rf pulse with the required frequency distribution.

The use of functions associated with filters makes the "tailoring" in the frequency domain relatively simple. By first choosing filter types, the pattern of the excitation bands are determined. Symmetrically with respect to the carrier, a low-pass filter will cause excitation of a band of frequencies, a high-pass will suppress excitation of a band of frequencies, a bandpass filter will cause excitation of two discrete frequencies. The choice of the filter parameters will determine the exact shape of these frequency response functions in a predictable way.

BRIEF DESCRIPTION OF THE DRAWINGS

These and other features, objects, and advantages of the invention will be more fully apparent from the detailed description set forth below taken in conjunction with the drawings in which like reference characters identify corresponding throughout, and wherein.

DETAILED DESCRIPTION OF THE PREFERRED EMBODIMENT

Figure 1:
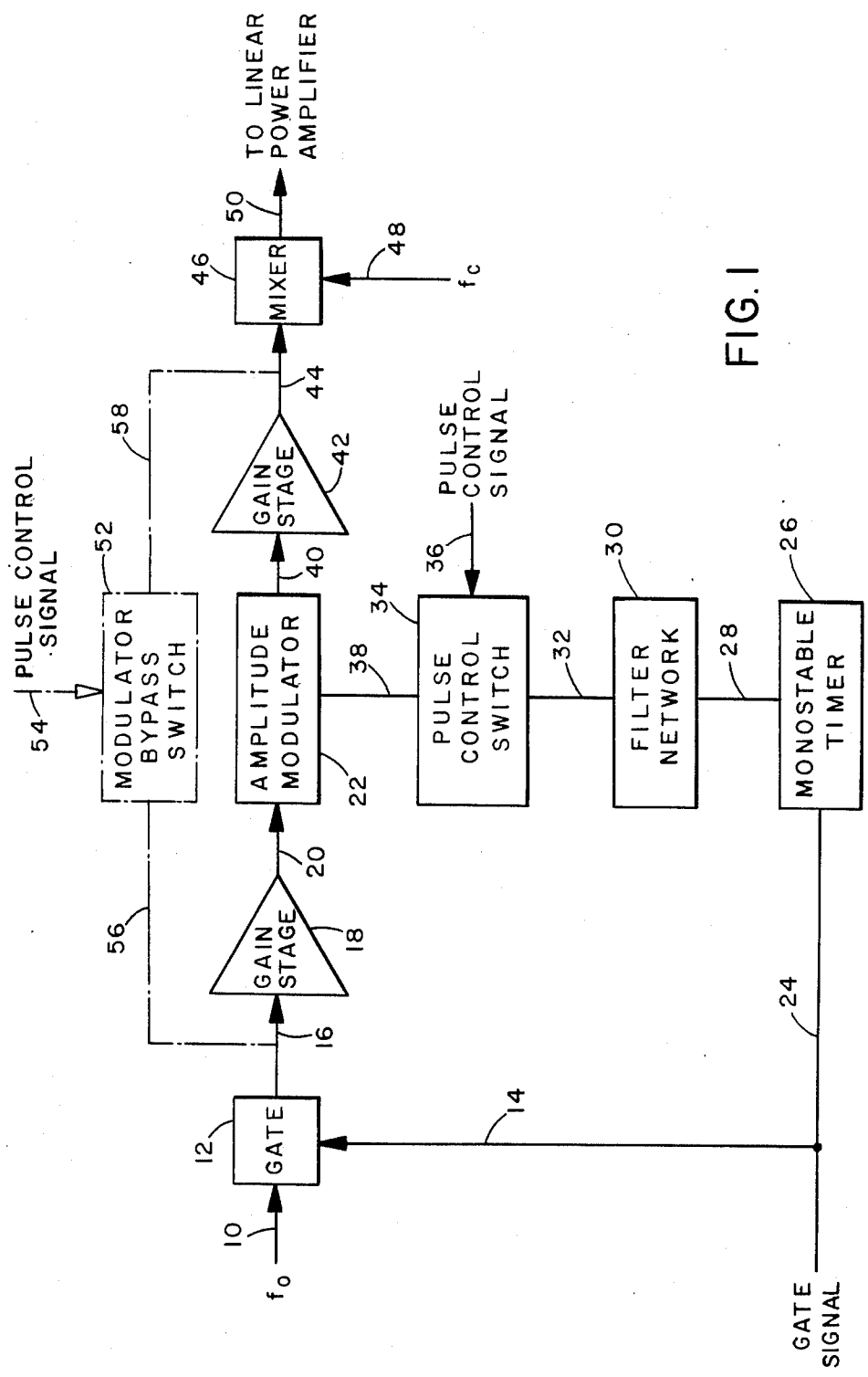
FIG. 1 is a schematical representation of the present invention in block diagram form.

Referring to FIG. 1, there is shown in block diagram form the frequency selective pulse generator of the present invention. In FIG. 1, an oscillator frequency $f_0$ is coupled on line 10 to the input of gate 12. A gate signal of duration T is applied on line 14 to a control input of gate 12. The output of gate 12 is coupled on line 16 to the input of gain stage 18. The output of gain stage 18 is coupled by line 20 to the input of amplitude modulator 22.

The gate signal is also coupled by line 24 to the input of a monostable timer 26. The output of monostable timer 26 is coupled by line 28 to the input of filter network 30. The output of filter network 30 is coupled on line 32 to pulse control switch 34. A pulse control signal is supplied on line 36 to a control input of pulse control switch 34. The output of pulse control switch 34 is provided on line 38 to a control input of amplitude modulator 22.

Pulse control switch 34 enables either the modulating signal, output from the filter network, to amplitude modulate the signal input to the amplitude modulator on line 20 or maintain a constant amplitude output from the amplitude modulator. Using the pulse control switch 34, one may select between a hard pulse or a frequency selective pulse. The pulse control signal may be generated by manual control or computer control for selecting between the two pulse types. In effect, pulse control switch 34 permits multiplexing between a hard and a frequency selective pulse. Pulse control switch 34 may include a gain stage for controlling the amplitude of the modulating signal output from filter network 30.

The output of amplitude modulator 22 is provided on line 40 to the input of gain stage 42. The output of gain stage 42 is coupled on line 44 to the input of mixer 46. Mixer 46 heterodynes the signal received on line 44 with a high-frequency carrier input to mixer 46 on line 48. The output of mixer 46 is provided on line 50 through a gate (not shown) and controlled by the gate signal to permit the output of mixer 46 to be presented to a bandpass filter tuned at $f_0$ and $f_c$ (also not shown). The output of the bandpass filter is then fed into the linear power amplifier of the spectrometer.

The oscillator frequency $f_0$ s typically provided by the spectrometer itself along with the gate signal and gate 12. Mixer 46 along with a frequency synthesizer that generates the carrier frequency $f_c$ is also included within the spectrometer equipment.

In an optional configuration, pulse control switch 34 may be eliminated or used in combination with bypass switch 52. Bypass switch 52 is under control of the pulse control signal and permits the signal output from gate 12 on line 56 to be coupled on line 58 to the input of mixer 46. Bypass switch 52 effectively decouples the frequency selective pulse generating circuit comprised of monostable timer 26, filter network 30, pulse control switch 34 (if used), gain stages 18 and 42, and amplitude modulator 22 from the input of mixer 46 and connects the input to output of gate 12.

In a preferred embodiment of the invention, gate 12 is a controlled analog switch, which couples a high-frequency input signal to the output. For example, gate 12 may be a device sold by Merrimac Industries, Inc. of Caldwell, NJ, under Part No. SE-11D50.

Gain stages 18 and 42 are typical high-frequency gain stages constructed from discrete components or operational amplifiers well-known in the art to provide adjustable amplitude in the output signal for the processing.

Monostable timer 26 is typically a monostable multivibrator circuit constructed from a timer bearing Part No. SE555 of Signetics Corporation, which triggers a short output pulse upon the leading edge of the input gate signal. The output of monostable 26 is fed into filter network 30.

Filter network 30 may contain a single one or a plurality of electrical frequency filters. Filter network may contain a combination of low-pass, high-pass, bandpass, or band-reject filters, and any combination thereof. By passing the broadband signal generated by the pulse output of monostable timer 26 through a low-pass filter in filter network 30, all the frequencies above the cutoff frequencies $f_{fc}$ are removed. This results in a band of excitation frequencies centered at the rf carrier $f_0$ and extends $\pm f_{fc}$ therefrom. One embodiment of the invention utilized a low-pass filter module manufactured by Frequency Devices, Model No. 780. By operating with the filter in the high-pass mode, all frequencies below a minimum value $f_{fc}$ are rejected. Therefore, a broad band of rf frequencies are generated, but frequencies located within $\pm f_{fc}$ of the rf carrier $f_0$ are eliminated. Highly selective excitation frequencies can be obtained with the use of high Q bandpass or band reject filters. The bandpass filter will cause excitation at only two frequencies located at $\pm f_{fc}$ of the carrier with the bandwidth of excitation being adjustable in accordance with the filter quality factor, Q.

The above-described frequency-domain responses of the filters are equivalently described in the time domain by the filter impulse response. These time varying functions can, therefore, directly be used to modulate the carrier.

In suppressing a solvent peak, a band-reject filter could be used to cause broadband excitation, except at two discrete frequencies at $\pm f_{fc}$ from the carrier, $f_0$. By adjusting the band-reject filters and/or the carrier (fc) so that $\pm f_{fc}$ or $-f_{fc}$ is centered at the solvent peak, the solvent peak will not be excited. In effect the four filter types mentioned may also be used in any combinations, i.e., series and/or parallel, to create a large number of excitation patterns.

Pulse control switch 34 (optional) is constructed as a bypass switch, which permits the output of filter network to be presented directly to the control input of the amplitude modulator 22 when modulation of the pulse is desired. When amplitude modulation is desired, pulse control switch directly couples the output of filter network 30 to the control input of amplitude modulator 22. However, in response to a pulse control signal, pulse control switch drives the control input of the amplitude modulator such that the modulator provides a full output signal in response to a input signal. The pulse control signal may be generated from the computer that controls the spectrometer so as to permit either a hard pulse, amplitude modulator having full output, or a frequency selective pulse as determined by the output of the filter network. Most existing NMR systems have a separate channel for hard pulses and won't need this switch.

Amplitude modulator 22 is a linear-balanced modulator-demodulator circuit, which could be built from a modulator chip from Motorola, Inc., Part No. MC1436G. The balanced modulator-demodulator circuit may also include an emitter-follower circuit to provide impedance matching or buffering to gain stage 42, or mixer 46 when gain stage 42 is not required. The amplitude modulator could also be used to insert a frequency component at $f_0$, if so desired.

Bypass switch 52, if included, may be constructed from an analog control switch similar to gate 12. Bypass switch 52 responds to the pulse control signal provided on line 54 so as to directly couple the output of gate 12 to the input of mixer 46. The implementation of bypass switch 52 permits pulse selection, as did pulse control switch 34.

Mixer 46 is generally found within the spectrometer and is typically a diode mixer well-known in the art.

Figure 2A:
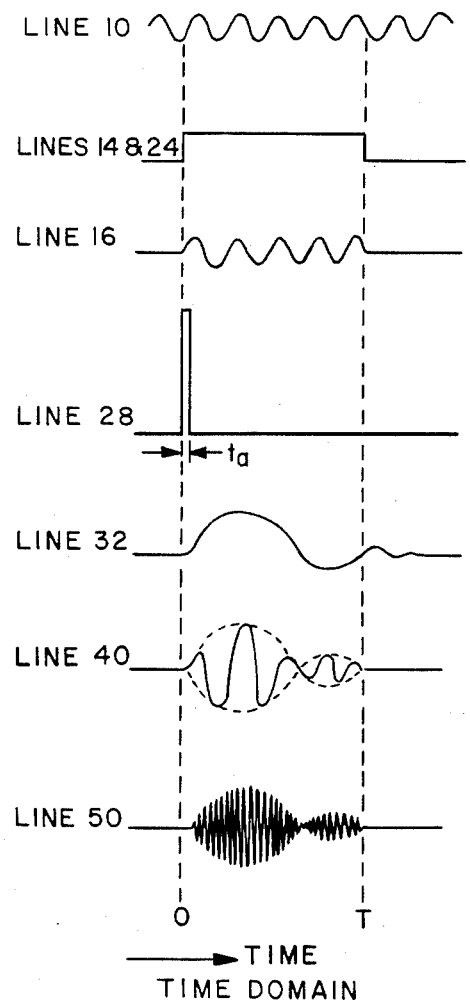
FIGS. 2a–2b are graphical representations in the time domain and the frequency domain of selected signals corresponding to the block diagram of FIG. 1.

The frequency $f_0$ s supplied by the spectrometer at typically 10 MHz and is illustrated in FIG. 2a in the time domain. The carrier $f_0$ may be at 360 MHz, thereby eliminating the need for mixer 46 and the carrier $f_c$, which is typically 350 MHz. With the carrier frequency at 10MHz input into gate 12 on line 10, a gate signal is supplied by the computer in the spectrometer during a predetermined period T, which gates on gate 12 from the time $t=0$ to $t=T$. The duration T is typically in the order of 1ms–10ms for selective pulses and 5ms–20ms for hard pulses. The gate signal on lines 14 and 24 is illustrated in FIG. 2a in the time domain.

The gate signal initiates an rf carrier pulse on line 16 of duration T, as is illustrated in FIG. 2a. The rf carrier pulse on line 16 is amplified in gain stage 18 and provided on line 20 to the input of amplitude modulator 22.

The gate signal, in addition to controlling gate 12, is provided on line 24 to monostable timer 26.

The leading edge of the gate signal on line 24 triggers monostable timer 26. The output of monostable timer 26 is a short pulse of duration $t_a$, which is typically 50μs. However, monostable timer 26 may be replaced with a series of timers so as to provide a sequence of output pulses to filter network 30.

Figure 2B:
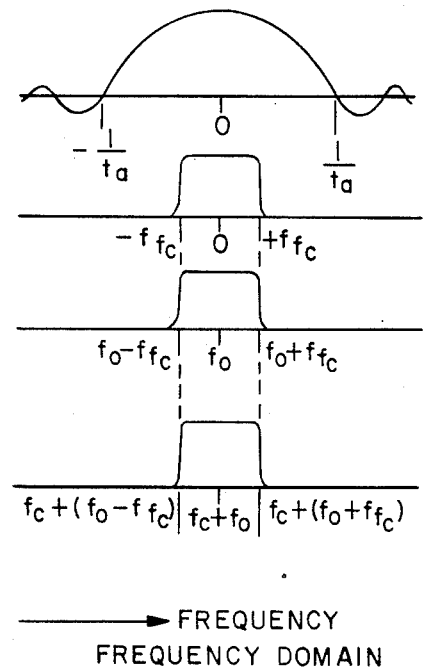

The pulse on line 28 evokes a predetermined response at the output of filter network 32 dependent upon the transfer function of the particular filter selected therein. The output signal from filter 30 (illustrated in FIG. 2a) is due to the transfer function of a low-pass filter in response to the pulse on line 28. The corresponding output on line 32 in the frequency domain is illustrated in FIG. 2b. The filter network responds to the sequence of timer output pulses with a modified filter network output signal as compared to a single pulse input. This feature would provide increased flexibility in creating the modulation function from the filter network.

The time varying function on line 32 is coupled through pulse control switch 34 on line 38 to the control input of amplitude modulator 22. Amplitude modulator 22 provides linear amplitude modulation of the pulsed carrier frequency $f_0$ output from gate 12 in accordance with the time varying function provided to the control input of amplitude modulator 22. The output of amplitude modulator 22 is provided on line 40 as an amplitude modulated pulse carrier having an envelope corresponding to the modulating function on line 32 during the period $t=0$ to $t=T$. FIG. 2b illustrates the frequency domain function corresponding to the time domain signal appearing on line 40. The corresponding frequency domain function is similar to that appearing on line 32 only centered about the frequency $f_0$. The amplitude modulated carrier pulse appearing on line 40 is truncated in the example after the second node for optimizing the excitation response and minimizing the duration of the excitation pulse. (A shorter pulse could still give an acceptable response.) Hence, the output of the amplitude modulator 22 is a signal that contains a band of frequencies centered about the 10 MHz carrier $f_0$.

The output signal from amplitude modulator 22 is fed through a gain stage 42 where it is amplified for mixing in mixer 46 with a 350 MHz signal from a frequency synthesizer in the spectrometer. Mixer 46 heterodynes the signals so as to shift the band of frequencies centered about the 10 MHz to a band of frequencies centered about 360 MHz and 340 MHz. A filter, such as a band-pass filter, removes the 340 MHz signals so as to provide an excitation pulse centered about only at the 360 MHz carrier.

The output of mixer 46 is provided to a gate in the spectrometer controlled by the spectrometer gate signal and from there to a linear power amplifier also located within the spectrometer. FIG. 2a illustrates in the time domain the excitation pulse appearing at the output of mixer 46 on line 50 and FIG. 2b illustrates the corresponding frequency distribution.

In general, the filter network 30 is used to selectively remove from a broadband of frequencies, all frequencies except those desired. When the filtered signal is mixed with a narrowband rf signal, the resultant signal generated contains a desired spectral band in the rf range. Correspondingly, in the time domain, the pulse output from monostable timer 26 is used to generate a pulse-shaping function at the output of filter network 30, which modulates the amplitude of the rf signal with the appropriate time dependent function so to generate the desired spectral distribution. Filter network 30 may include a variable gain stage for controlling the output amplitude of the filter network.

Figure 3A:
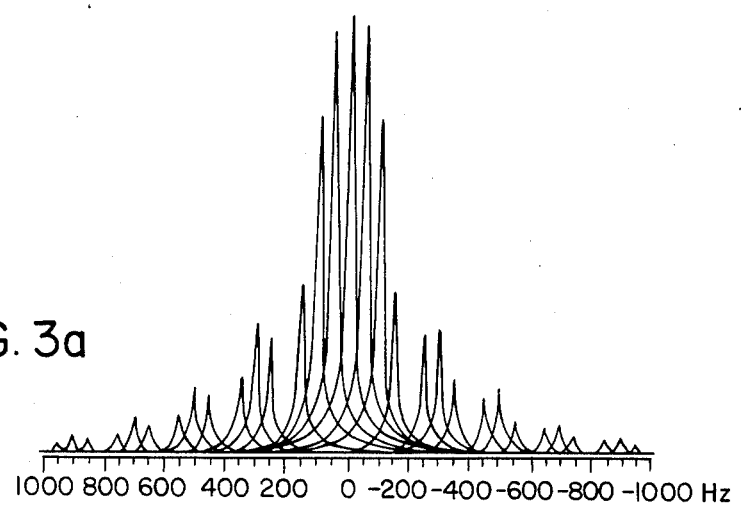
FIG. 3a–3b are graphical representations of the spectral response of a soft pulse and a frequency selective pulse.
Figure 3B:
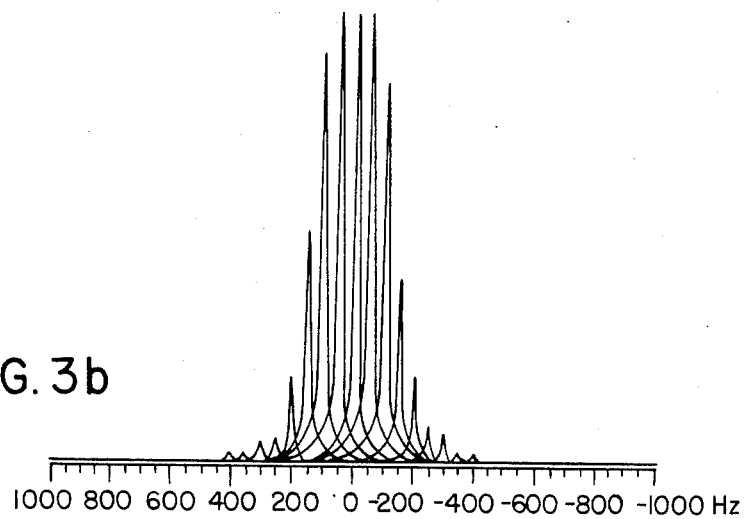

FIG. 3a illustrates the selectivity of a soft pulse with a 360 MHz and T=5ms carrier for the excitation of a sample of paramagnetically doped HDO. FIG. 3b illustrates the response of the same sample when using a frequency selective pulse using a low-pass audio filter with a bandwidthof ±130 Hz and T=18ms.

In the comparison of FIGS. 3a and 3b the band of excitation frequencies generated by the frequency selective method is relatively flat over a 250 Hz spectral range about the 360 MHz carrier, but dies off rapidly outside this region. In contrast, the intensity of the soft pulse falls rapidly at approximately ±200 Hz about the carrier frequency of 360 MHz, but has considerable additional intensity well away from the center.

Figure 4A:
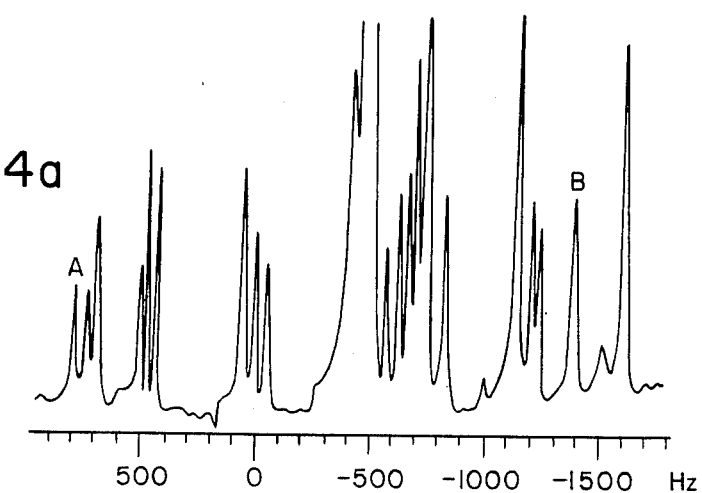
FIGS. 4a-4c illustrate the frequency resonance spectrum of a sample of d(A-T-A-T) using a hard pulse, a frequency selective pulse utilizing a low-pass filter, and a frequency selective pulse utilizing a bandpass filter.

Two exemplary applications of the frequency selective method of the present invention are illustrated in FIG. 4. FIG. 4a illustrates the spectrum of a d(A-T-A-T) sample at 360 MHz in $D_2O$ using a standard 90° hard pulse. It should be noted in FIG. 4a that a strong solvent peak occurs at approximately −450 Hz about the center frequency.

Figure 4B:
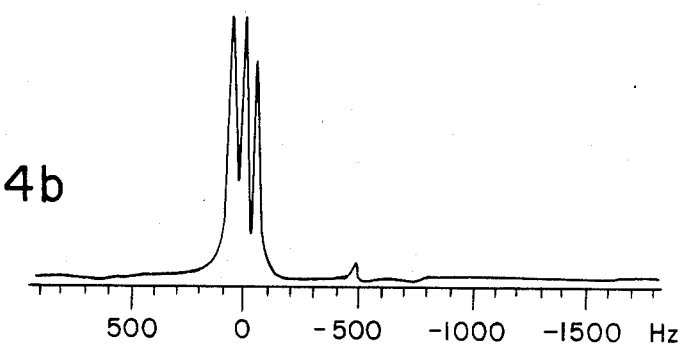

FIG. 4b illustrates the spectrum of a collection of resonances of a d(A-T-A-T) sample located about the 360 MHz carrier, which have been excited by a frequency selective pulse generated by passing the broadband signal through a low-pass filter with a ±130 Hz bandwidth. A comparison of the spectrum illustrated in FIG. 4b with the full spectrum illustrated in FIG. 4a illustrates the high degree of selectivity obtained in the absence of nonlinear phase distortion when using a selective pulse. Also, note the increased resolution of the excited resonances when using the tailored pulse. In FIG. 4b, the spectrum was phased by time-shifting the origin of the free induction decay before Fourier transformation. This procedure was needed since the large linear phase (introduced by the long pulse time T) could not be corrected by the computer software routine.

Figure 4C:
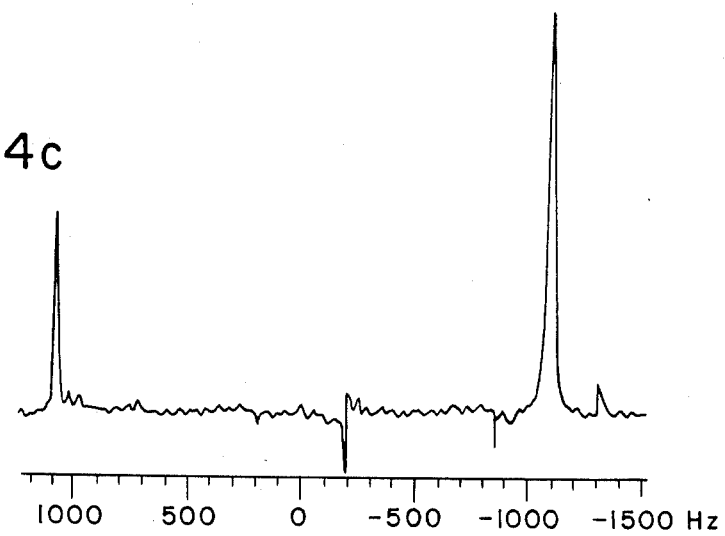

FIG. 4c illustrates the spectrum when the broadband signal was passed through a high-Q bandpass filter before modulating the carrier to generate a pair of rf frequencies located at ±1086 Hz on either side In this example, the carrier frequency was adjusted to be midway between the two resonances marked "A"0 and "B" in the spectrum of FIG. 4a. In FIG. 4c, only the pair of marked resonances of FIG. 4a are excited. In the spectrum of FIG. 4c, only two resonances in the d(A-T-A-T) sample have been selectively excited.

The response of the nuclear spins to an excitation function obtained by pulsing a low-pass Butterworth filter is analyzed and compared with the soft pulse response. This method can also be used to calculate the response to the high-pass, bandpass, and band-reject filter types by simply changing the filter transfer function. For the following discussion $F_0$ represents the cutoff frequency of the filter.

For a second order low-pass filter, the transfer function is given by:

$$f_1(s) = \frac{k}{s^2 + a_1 s + a_0} \quad [1]$$

where $k = \Omega_o^2/Q$, $a_1 = \Omega_o/Q$, $a_0 = \Omega_o^2$, and $\Omega_o = 2\pi F_0$.

By using $s = \Omega j$, both the magnitude and phase characteristics of the filter can be calculated as a function of frequency. Instead of expressing the transfer function in the complex frequency domain, a Laplace transform (or Fourier transform) of f(s) will yield F(t) by the expression:

$$F_1(t) = \frac{k}{b} e^{at} \sin(bt) \quad [2]$$

where $a = -\Omega_o/2Q$ and $b = (\Omega_o/2Q)(4Q^2 - 1)^{1/2}$. The function in Equation [2] is the corresponding time response of the filter to an impulse function $\delta(t)$.

A fourth order low-pass filter could be realized by two second-order filters in series, i.e., the square of Equation [1], wherein:

$$f_2(s) = [f_1(s)]^2 = \frac{k^2}{(s^2 + a_1 s + a_0)^2} \quad [3]$$

The Laplace transform of Equation [3] is given by:

$$F_2(t) = \frac{k^2}{2b^3} e^{at} [\sin(bt) - bt \cos(bt)] \quad [4]$$

where $a_0$, $a_1$, k, a, and b are as given in Equations [1] and [2]. For even higher roll-off (>48 dB/octave) more filters could be connected in series (or higher order filters used).

If the time-dependent function $F_2(t)$ is used to modulate the carrier, this will result in a frequency shift of all frequencies by the carrier frequency. The angular frequency $\Omega$ in Equation [3] will then correspond to the frequency offset from the carrier.

For small tip angles of the magnetization vector, the predicted response will simple follow the Fourier transform of $F_2(t)$, i.e., it will be identical to the filter characteristics given by Equation [3].

For larger angles, the Bloch equations have to be solved. Neglecting relaxation (for simplicity), these are given by:

$$\frac{dM_x}{dt} = \Delta\omega M_y \quad [5a]$$

$$\frac{dM_y}{dt} = -\Delta\omega M_x - \omega_1(t) M_z \quad [5b]$$

$$\frac{dM_z}{dt} = \omega_1(t) \cdot M_y \quad [5c]$$

where $\Delta\Omega$ is the frequency offset from the carrier, and:

$$\Omega_1(t) = -\gamma B_1(t) = -\gamma BF(a) \quad [6]$$

The gyromagnetic ration $\gamma$ depends on the nuclei; B is a constant, dependent on the magnetic field strength; and F(t) is the excitation function.

The tip angle (in radians) at resonance is defined as:

$$\theta = \gamma B_1(t) T \quad [7]$$

where T is the length of the excitation pulse. If F(t) is normalized:

$$F_{norm}(t) = \frac{F(t)}{\frac{1}{T} \int_0^T F(t) dt} \quad [8]$$

then the final tip angle $\theta$ will be independent of the functional forms of the excitation function. Thus, combining Equations [6]–[8] will give:

$$\omega_1(t) = -\theta \frac{F(t)}{\int_0^T F(t) dt} \quad [9]$$

Equations [5a]–[5c] are of the type:

$$\frac{dv}{dx} = F[x(t)] \quad [10]$$

These can be solved numerically by the Runge-Kutta method. By a step-by-step procedure $y(t + \Delta t)$ is approximated from y(t). For second order accuracy, the solution is given $$y(t + \Delta t) = y(t) + \frac{\Delta t}{2} (F[x(t)] + F[x(t + \Delta t)]) \quad [11]$$

The use of this solution on Equations [5a]-[5c] and solving the resulting equation system will give the magnetization at any time during the pulse:

$$M_y(t + \Delta t) = \left( -\Delta t \Delta \omega M_x(t) + \left[ 1 - \frac{(\Delta t)^2}{2} \omega_1(t + \Delta t) \omega_1(t) - \frac{(\Delta t \Delta \omega)^2}{2} \right] M_y(t) - \frac{\Delta t}{2} [\omega_1(t) + \omega_1(t + \Delta t)] M_z(t) \right) / \left( 1 + \left[ \frac{\Delta t}{2} \omega_1(t + \Delta t) \right]^2 + \frac{(\Delta t \Delta \omega)^2}{2} \right) \quad [12]$$

$$M_x(t + \Delta t) = M_x(t) + \frac{\Delta t \Delta \omega}{2} [M_y(t) + M_y(t + \Delta t)] \quad [13]$$

$$M_z(t + \Delta t) = M_z(t) + \frac{\Delta t}{2} [\omega_1(t) M_y(t) + \omega_1(t + \Delta t) M_y(t + \Delta t)] \quad [14]$$

At equilibrium $$M_x(0) = 0 \quad [15a]$$

$$M_y(0) = 0 \quad [15b]$$

$$M_z(0) = M0 \quad [nc]$$

which defines the initial conditions.

At any time t is after the end of the pulse (i.e., t=T), only free precession and relaxation influence the magnetization. If relaxation (for simplicity) onece again is neglected, then:

$$M_y(t \geq T) = M_y(T) \cos [\Delta \Omega(t-T)] + M_x(T) \sin [\Delta \Omega(t-T)] \quad [16]$$

$$M_x(t \geq T) = M_x(T) \cos [\Delta \Omega(t-T)[-M_y(T) \sin [\Delta \Omega(t-T)] \quad [17]$$

$$M_z(t \geq T) = M_z(T) \quad [18]$$

If a fourth order low-pass filter is chosen to be used, then F(T) is given by Equation [4]. After normalizing F(t) according to Equation [8], $\Omega_1(t)$ is given by Equation [9]:

$$\omega_1(t) = -\theta \cdot \frac{(a^2 + b^2)^2 e^{at}[\sin(bt) - bt \cos(bt)]}{e^{aT}([a^3 + 3ab^2 - Tb^2(a^2 + b^2)]\sin(bt) - [T ab(a^2 + b^2) + 2b^3]\cos(bT)) + 2b^3} \quad [19]$$

Figure 5A:
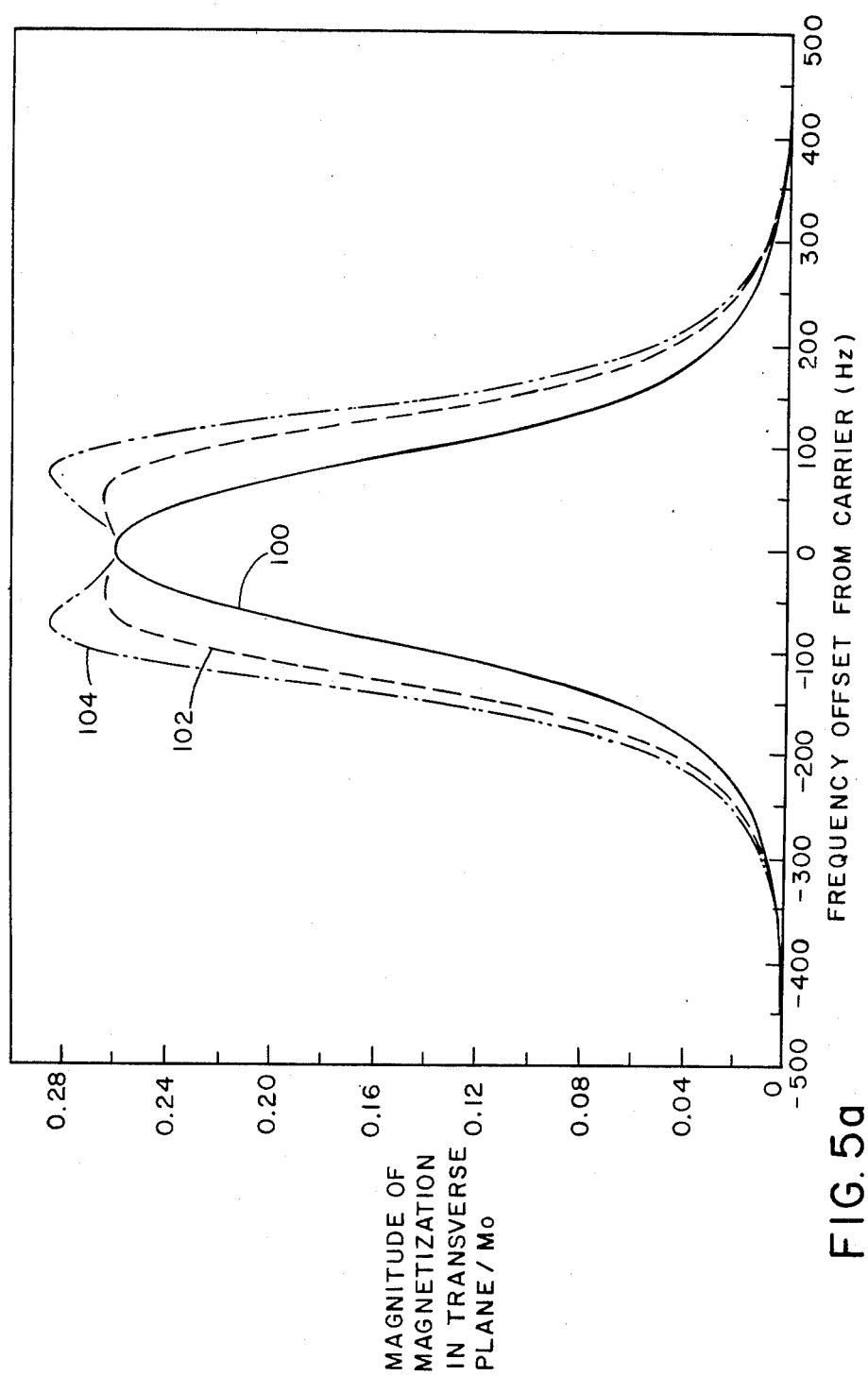
FIGS. 5a-5c illustrate the excitation profile of the frequency selective pulse as a function of filter-quality factor, carrier-pulse length, and tip angle.
Figure 5B:
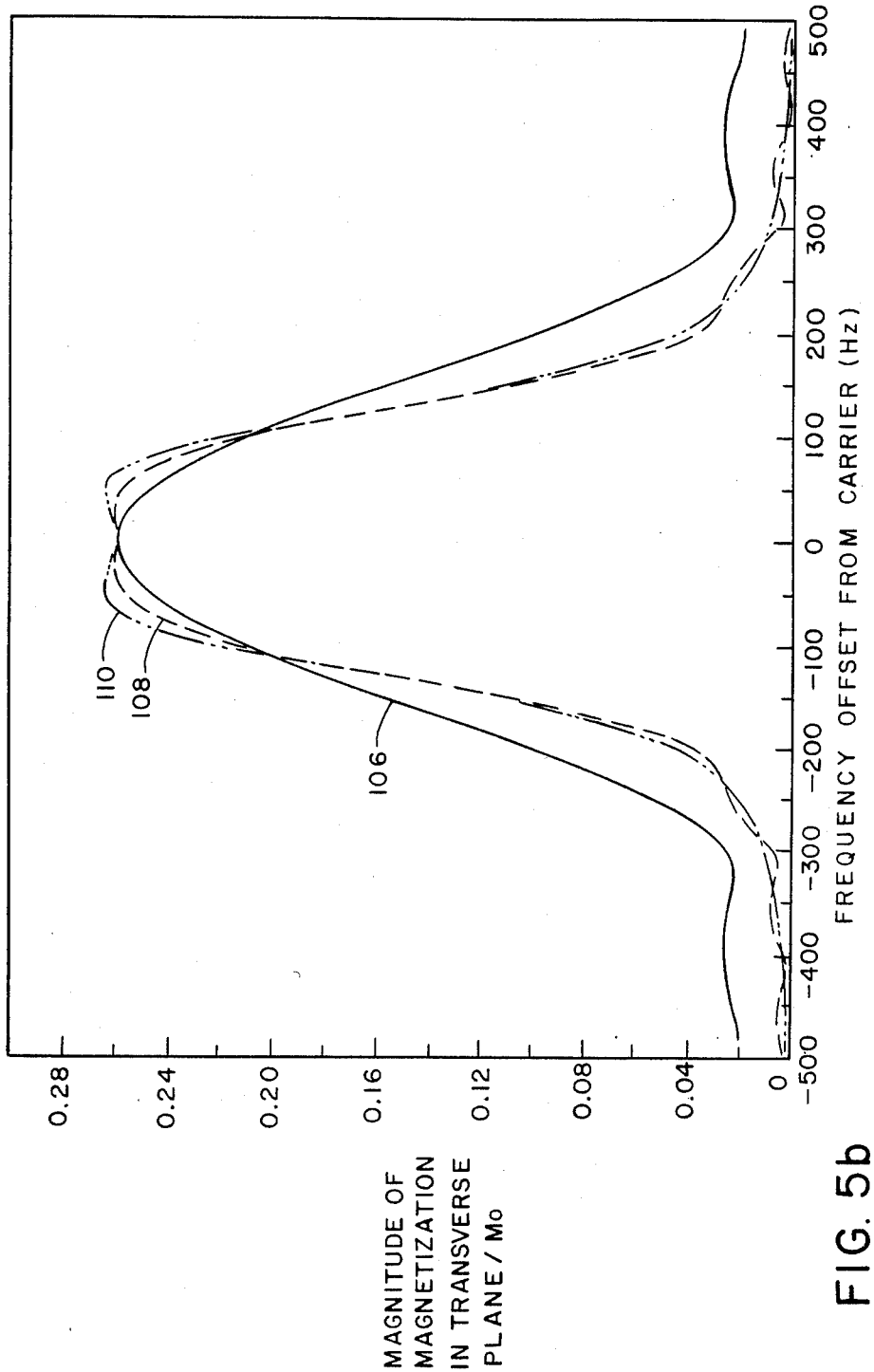
Figure 5C:
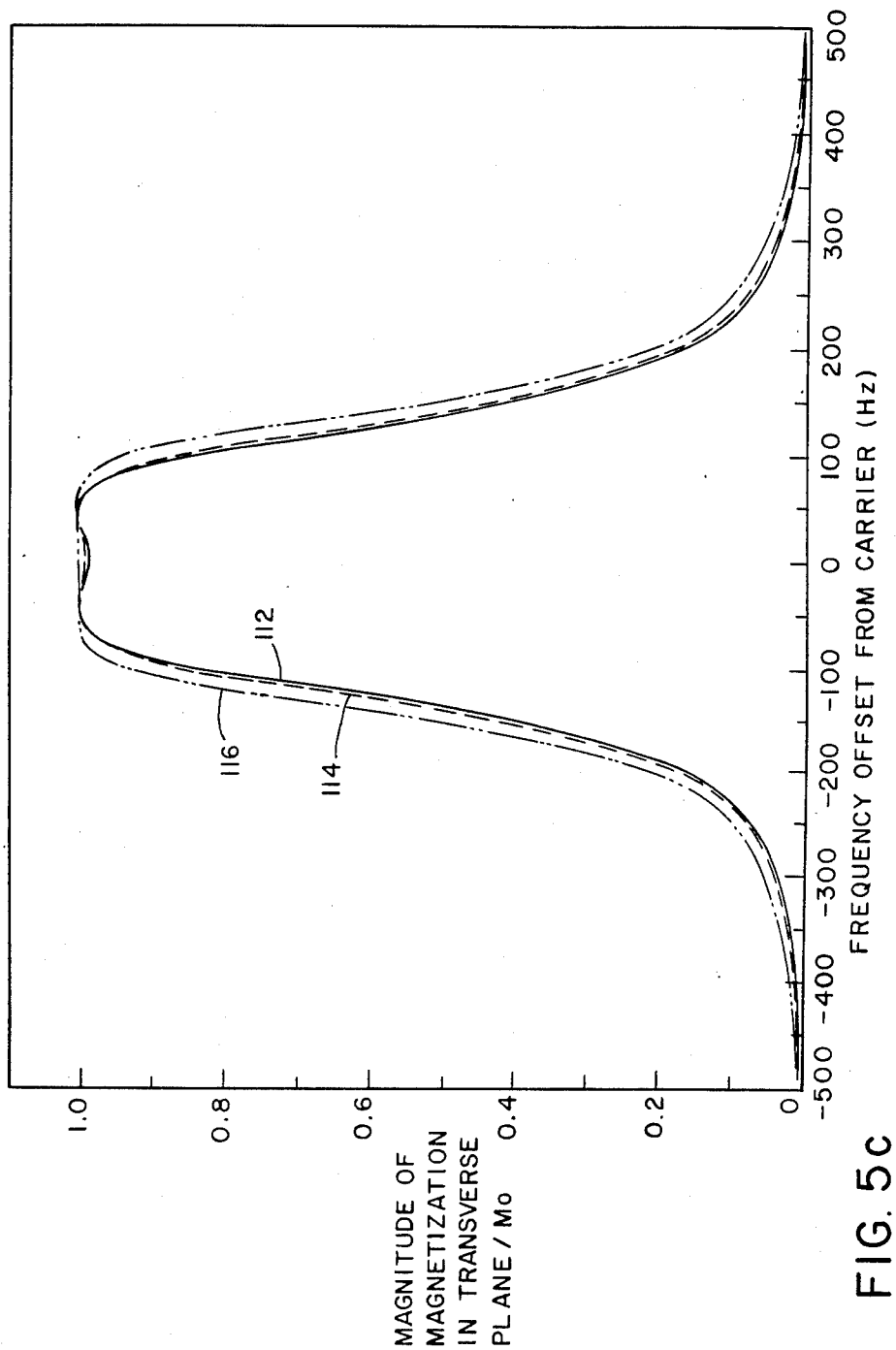

The calculated magnitude response as a function of quality factor Q, pulse length T, and tip angle are shown in FIGS. 5a-5c. FIG. 5a illustrates the tailored excitation profile as function of filter quality factor Q where Q=0.58 (illustrated by curve 100), Q=0.76 (illustrated by curve 102), and Q=0.85 (illustrated by curve 104) for a cutoff frequency $f_0=130$ Hz, a tip angle $\theta=15°$, and a pulse length T=30 ms.

FIG. 5b illustrates the tailored excitation profile as a function of pulse length T where T=5 ms (illustrated by curve 106), T=10 ms (illustrated by curve 108), and T=30 ms (illustrated by curve 110)for a fourth order low-pass filter with a quality factor Q=0.76, cutoff frequency $f_0=103$ Hz, and tip angle $\theta=15°$.

FIG. 5c illustrates the tailored excitation profile as function of tip angle $\theta$, where $\theta=15°$ (illustrated by curve 112), $\theta=45°$ (illustrated by curve 114), and $\theta=90°$ (illustrated by curve 116)for a fourth order low-pass filter with a quality factor Q=0.76, cutoff frequency $f_0=130$ Hz, and pulse length T=30 ms. [For comparison the amplitude of the curve with $\theta=15°$ has been magnified by $(\sin 15°)^{-1}$ and $\theta=45°$ with $(\sin 45°)^{-1}$.]

By optimizing Q, a maximum flat amplitude response can be obtained. Reducing the pulse length destroys the Fourier relationship, but a pulse length of $\sim 1.3/f_0$ is still acceptable. An increase in the tip angle of the magnetization vector causes reduced selectivity for a selective pulse.

Figure 6:
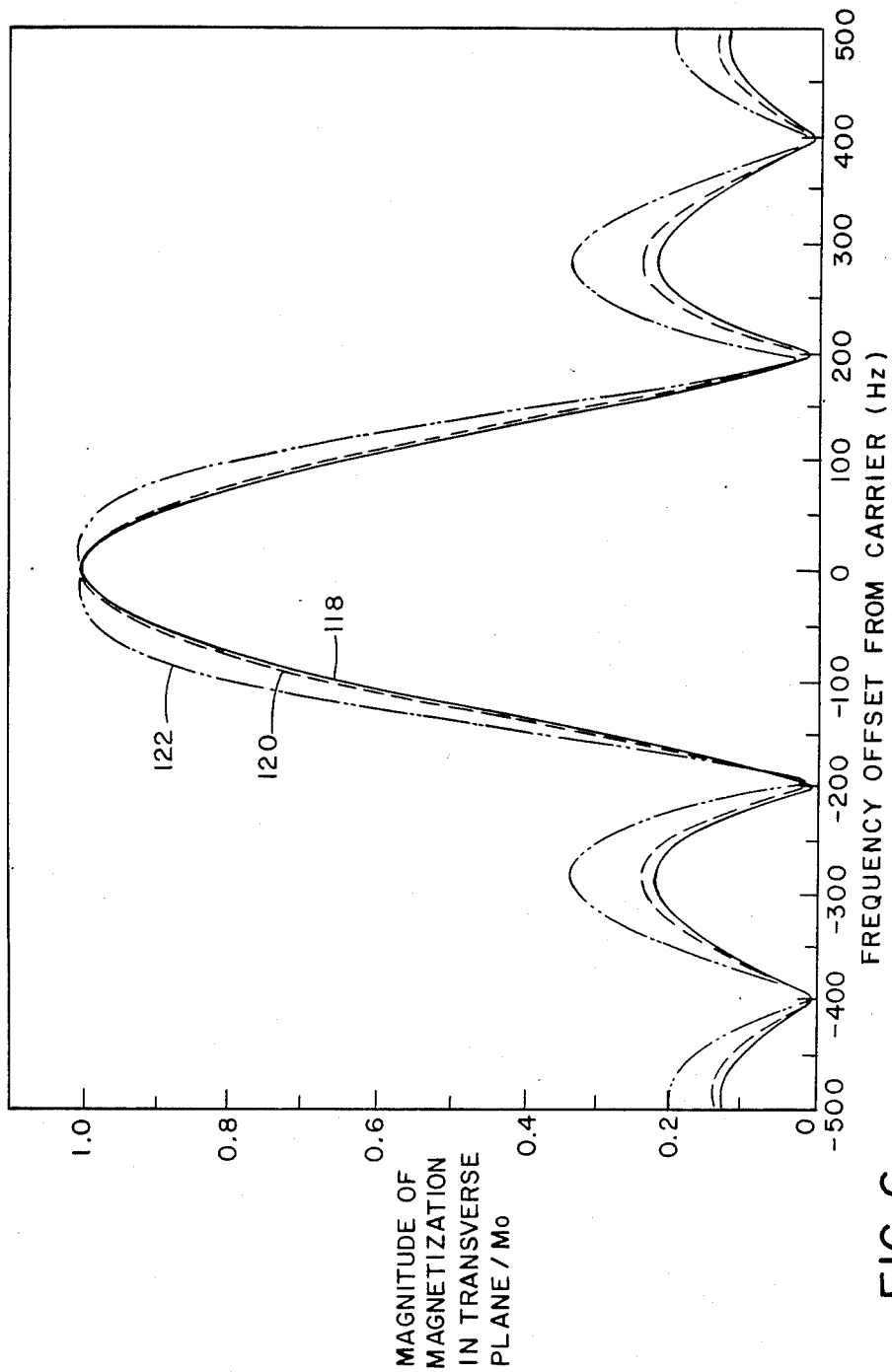
FIG. 6 illustrates the excitation profile of a soft pulse as a function of tip angle.

This is the case both for tailored and soft pulses as can be seen in, FIG. 6, which shows soft pulse excitation profile as function of tip angle where $\theta=15°$ (illustrated by curve 118), $\theta=45°$ (illustrated by curve 120), and $\theta=90°$ (illustrated by curve 122) for a pulse length T=5 ms. [For comparison, the amplitude of the curve with $\theta=15°$ has been magnified by $(\sin 15°)^{-1}$ and $\theta=45°$ with $(\sin 45°)^{-1}$.] In comparison of FIGS. 5 and 6, the effect of large tip angles on the tailored pulse is much less serious as can be seen in FIG. 5c.

It is sometimes desirable to give a selective 180° pulse that inverts all spins within a band of frequencies. Ideally, this should crate a "square well" in the frequency response of the longitudinal magnetization, and give no magnetization in the transverse plane.

Figure 7A:
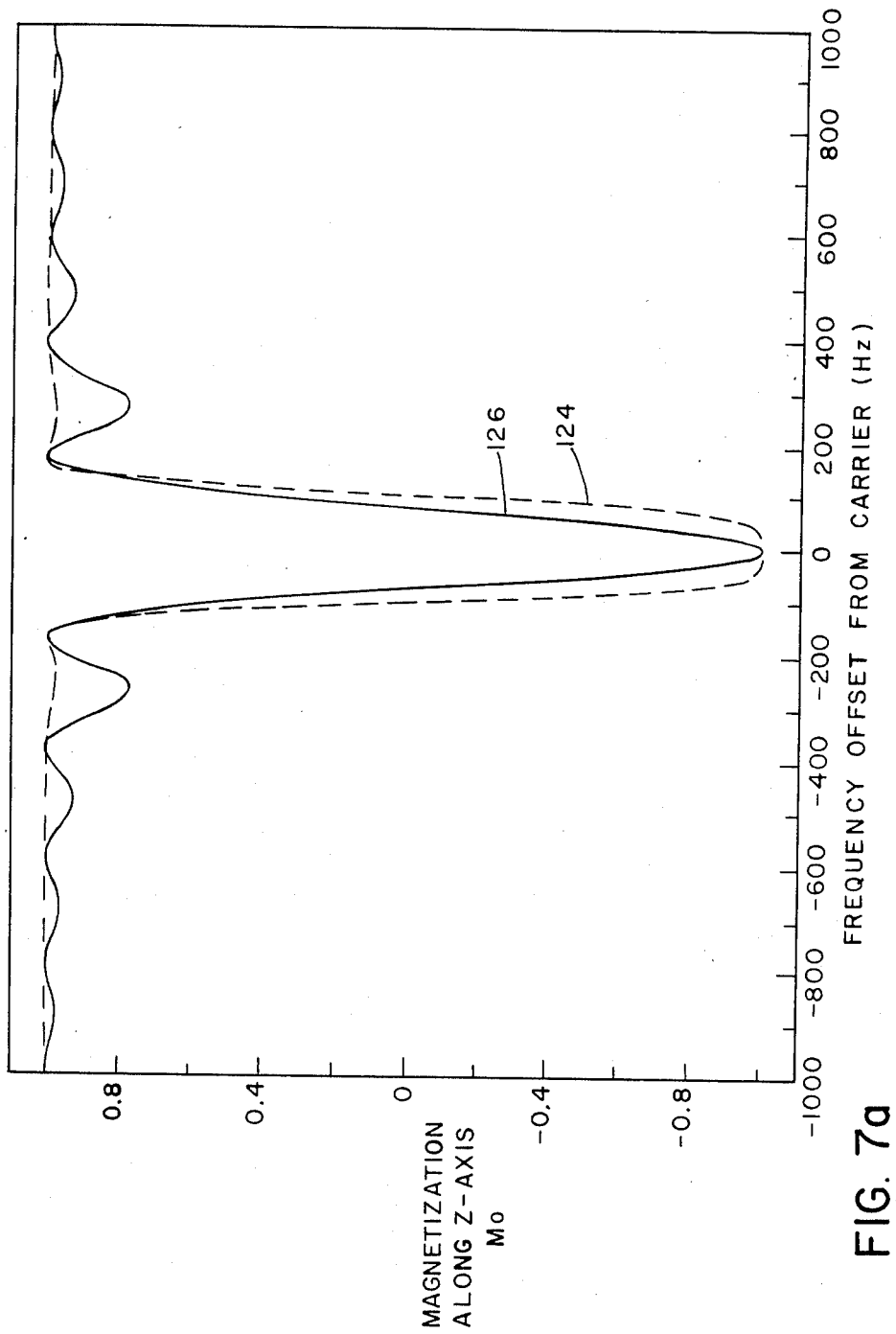
FIGS. 7a-7b illustrate the excitation profile for the longitudinal and transverse magnetization for a 180° inversion pulse.

In FIG. 7a, the result of a 180° inversion is calculated. FIG. 7a illustrates the excitation profile (longitudinal magnetization) for a 180° inversion pulse with a fourth order low-pass filter having a quality factor Q=1.0, cutoff frequency $f_0=130$ Hz and a pulse length T=18 ms (as illustrated by curve 124)and as a soft pulse having a pulse length of T=5 ms (illustrated by curve 126).

Figure 7B:
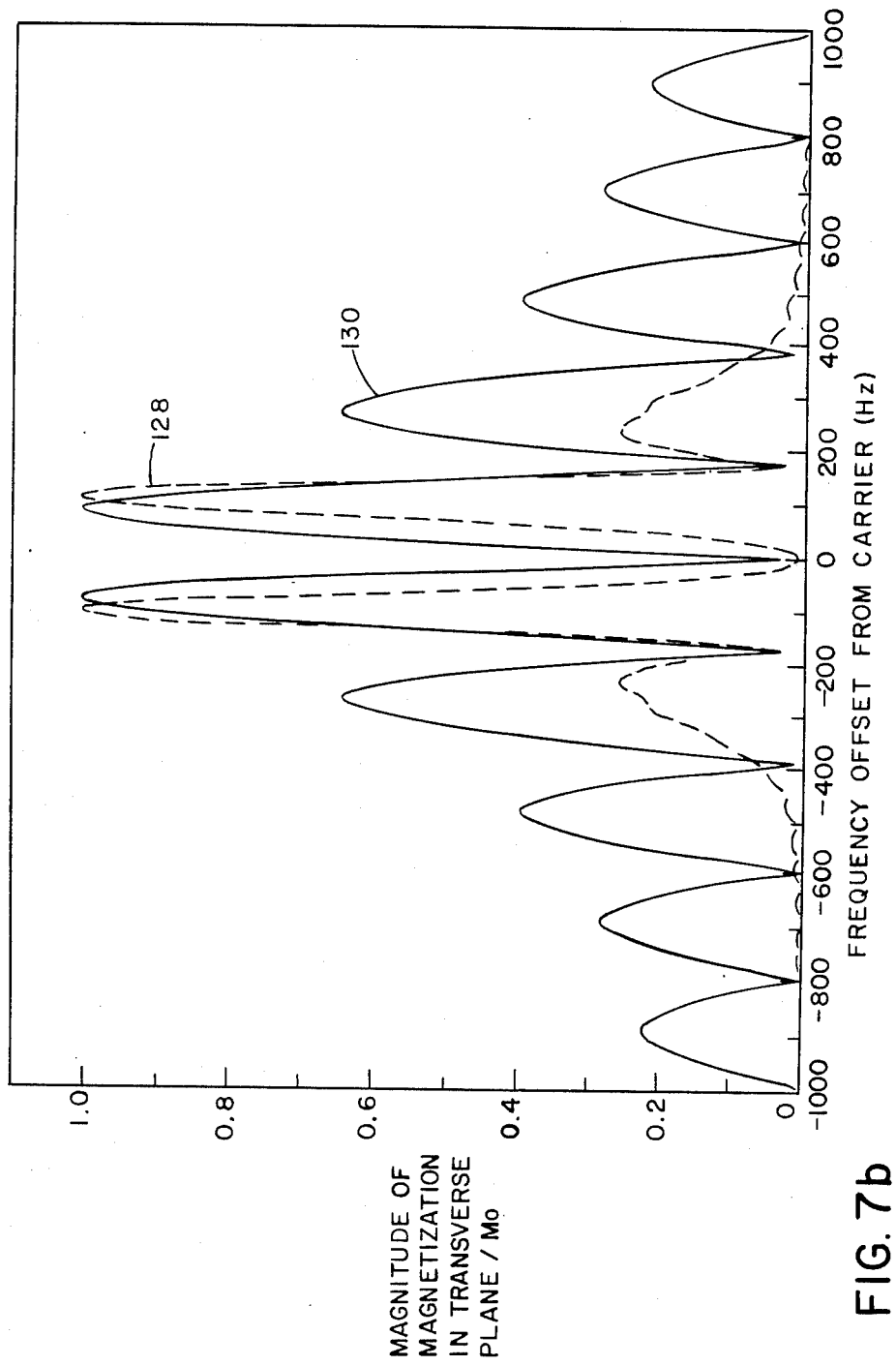

The tailored pulse gives a very good inversion of the Z-magnetization, but leaves some magnetization in the x-y plane as illustrated in FIG. 7b. FIG. 7b (selective pulse illustrated by curve 128 and soft pulse illustrated by curve 130) illustrates excitation profile (transverse magnetization) with the parameters the same as in FIG. 7a. This residue occurs due to the finite slope of the edges of the "square well." The remaining transverse magnetization could be destroyed by a homospoil pulse. By choosing a high Q value, the sharpness of the "well" is improved, but also cause a small amount of excitation near the edges. For a soft pulse, the result is worse with excitation extending far beyond the "well" (FIG. 7a, curve 126).

Another (often neglected) feature of selective excitation methods are the resulting big phase differences in the spectra. These are due to the spin precession during the long pulse times, which are often used, to the phase of the excitation function, and to imperfections in the NMR instrument. The calculated phase at the end of a soft pulse and a tailored pulse is shown in FIGS. 8a and 8b, respectively.

Figure 8A:
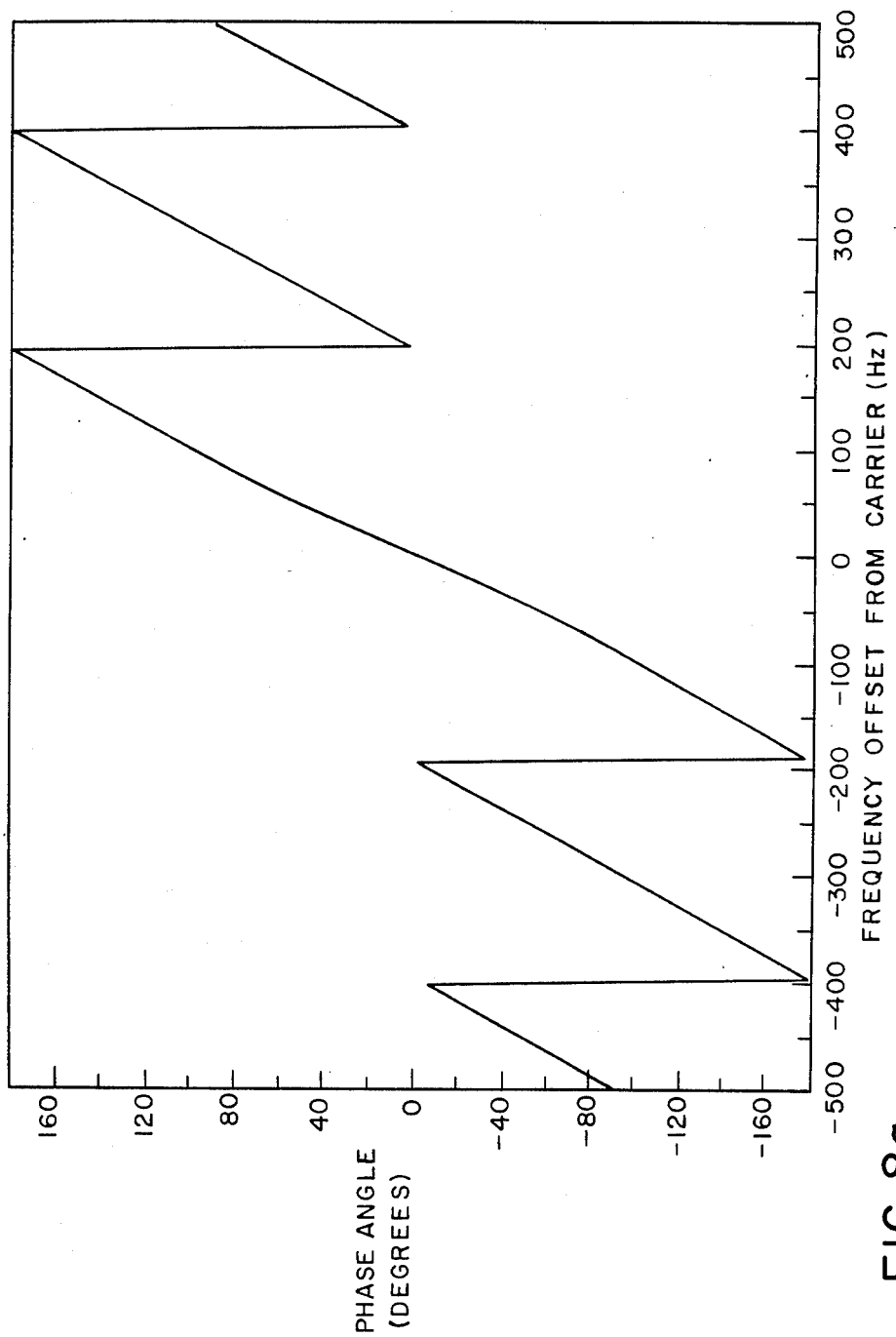
FIGS. 8a-8c illustrate the calculated phase of the soft pulse, frequency selective pulse, and comparison of the phase of the soft pulse and frequency selective pulse after linear phasing.
Figure 8B:
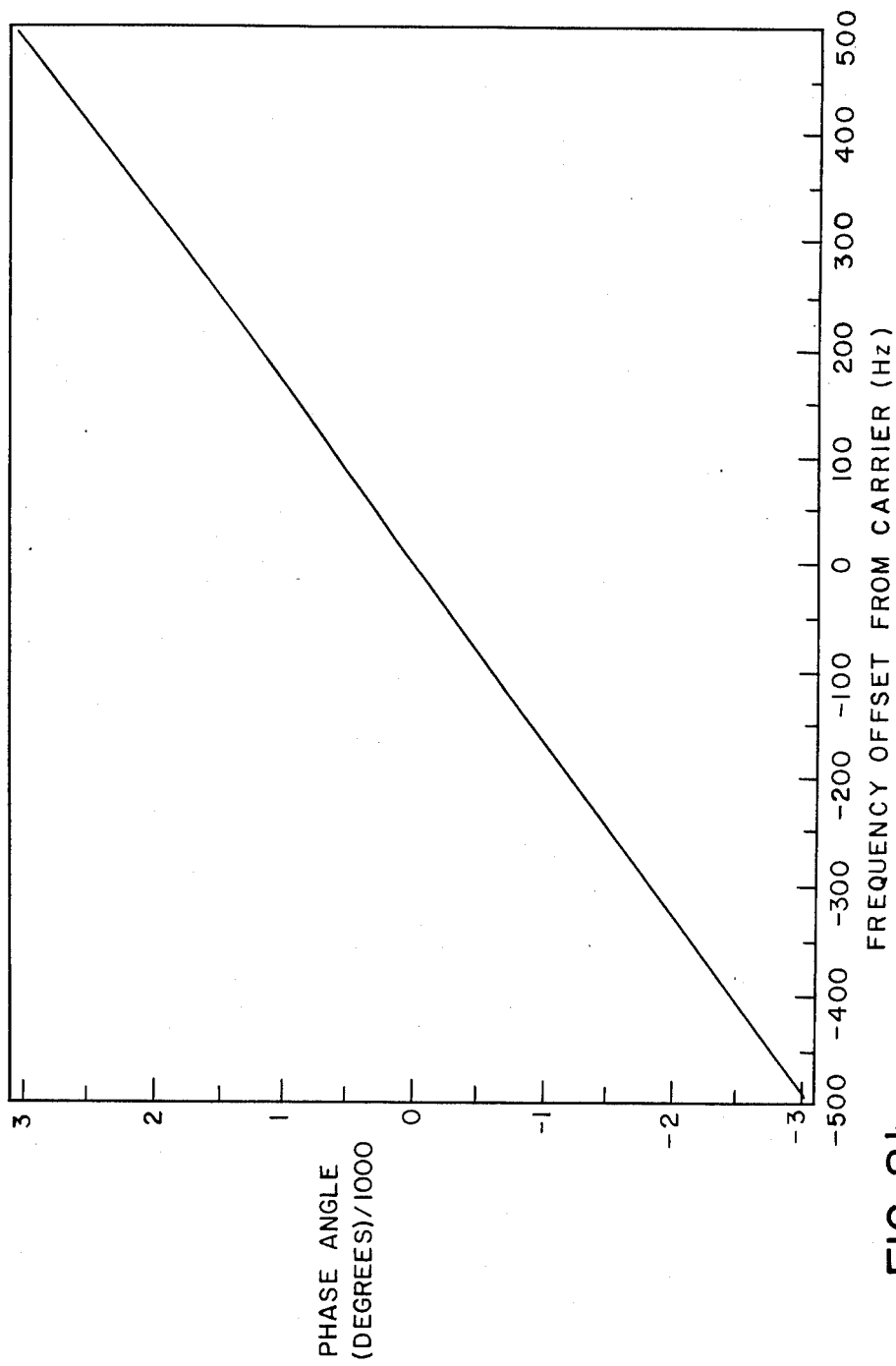

FIG. 8a illustrates the calculated phase at the end of the soft pulse where the tip angle $\theta=90°$ and pulse length T=5 ms. FIG. 8b illustrates the calculated phase at the end of the tailored excitation where the tip angle $\theta=90°$ for a fourth order low-pass filter with a quality factor Q=0.76, cutoff frequency $f_0=130$ Hz, and pulse length T=18 ms.

Figure 8C:
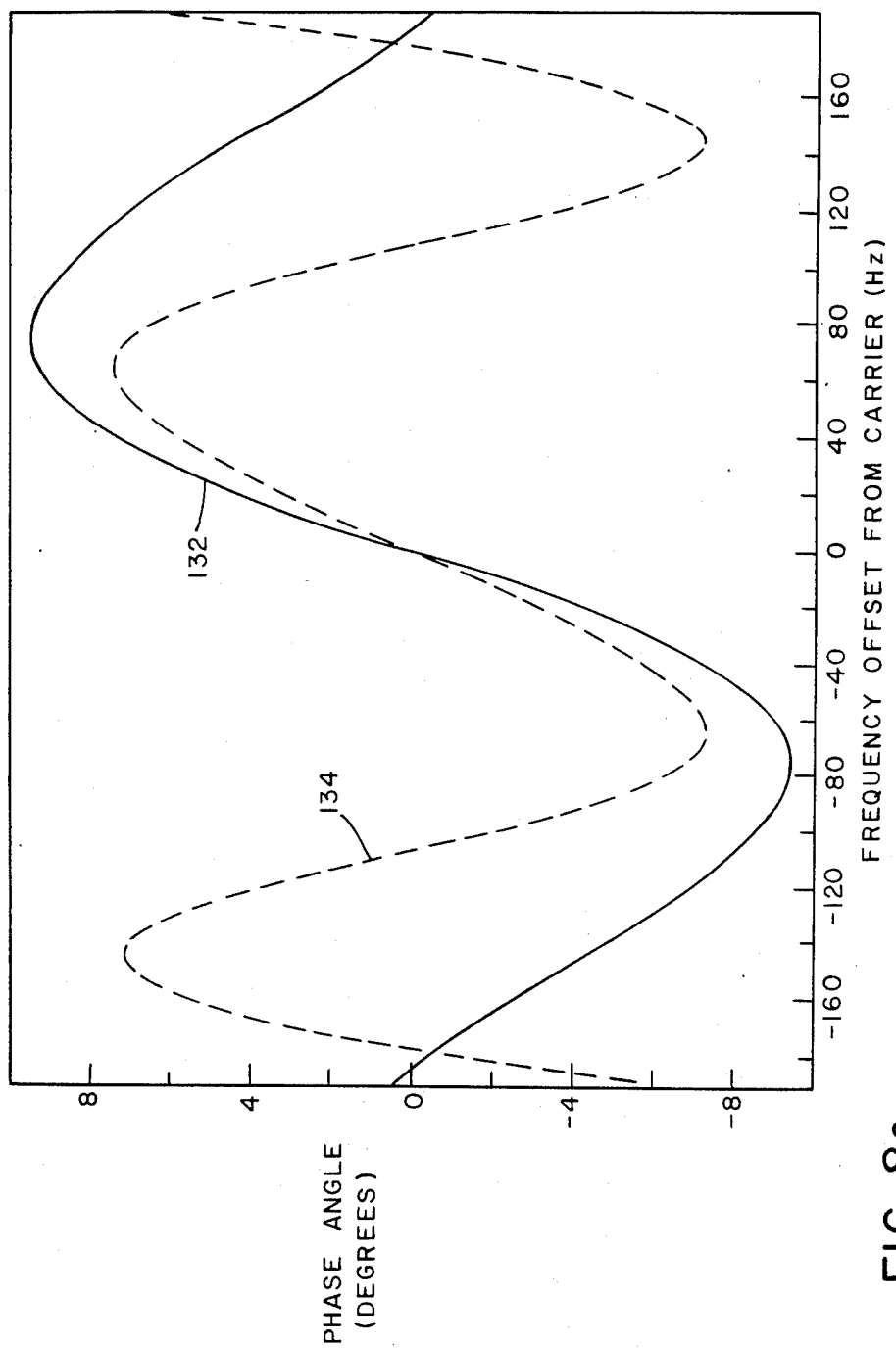

For the tailored pulse, the phase is almost linear, whereas the soft pulse has 180° phase shifts at the nodes of the sinc function. Within the frequencies of the first nodes of the soft pulse, both spectra can be phased to give an approximately constant phase. By time-shifting the origin of the free induction decay before Fourier transformation (using Equations [16] and [17]), the phase error has been brought down to a maximum of 9° for the soft pulse and 7° for the tailored excitation as shown in FIG. 8c. FIG. 8c illustrates the calculated phase after free precession of magnetization for D ms from end of pulse, where for a soft pulse D=2.60 ms (illustrated by curve 132) and for tailored excitation D=14.67 ms (illustrated by curve 134), with the parameters as in FIGS. 8a and 8b, respectively.

Figure 9A:
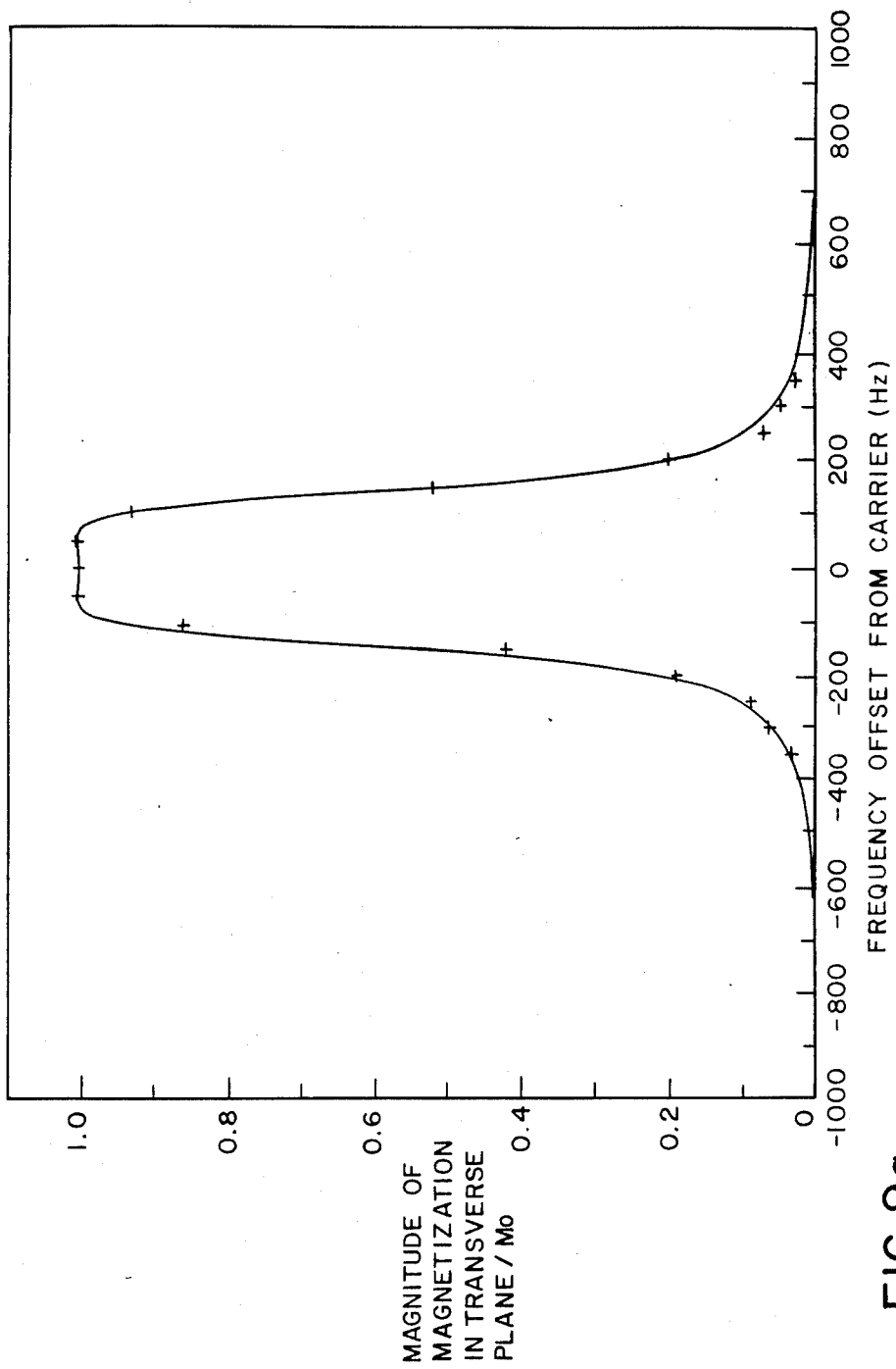
FIGS. 9a-]b illustrate calculated and experimental values for the excitation profile of the frequency selective pulse and the soft pulse.
Figure 9B:
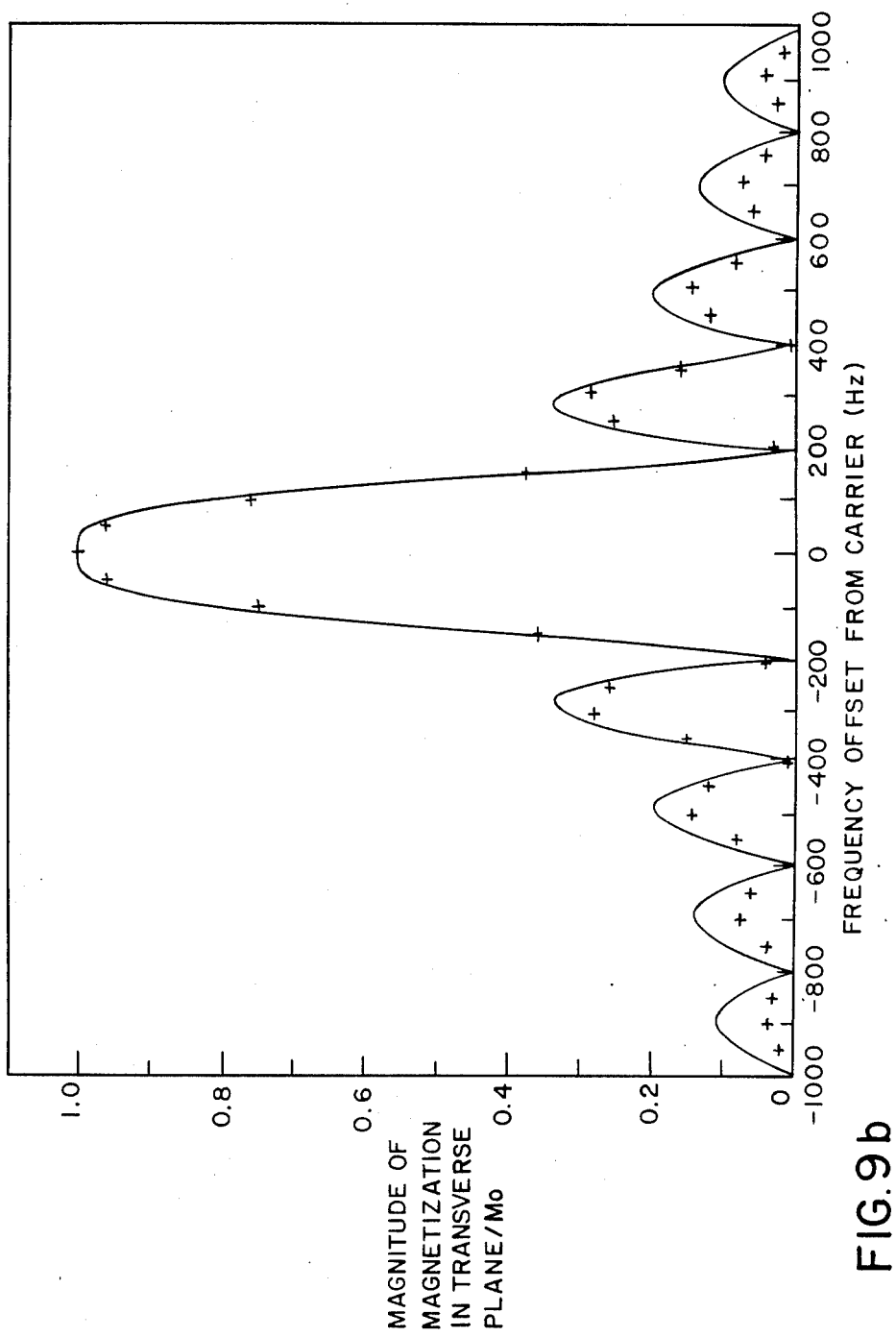

FIG. 9 illustrates the results of a selective pulse. Using the filter parameters, as set forth below with respect to FIG. 9a and 9b, the magnitude response according to Equations [12] and [13] have been calculated. Paramagnetically doped HDO (T1≈1.5s) was used to experimentally probe the excitation window by moving the carrier relative to the HDO resonance.

FIG. 9a illustrates the tailored excitation profile calculated from fourth order low-pass filter where the tip angle $\theta=90°$, cutoff frequency $f_0=130$ Hz, quality factor Q=0.76, and pulse length T=18 ms. Experimental values were obtained by measuring the magnitude as a function of resonance offset for a lightly doped HDO (illustrated by the symbol +). As can be seen in FIG. 9a, the experimental results (+) fit very well with the calculated spectra.

For comparison, the result of a soft pulse excitation is given in FIG. 9b, calculated from a pulse length of T=5 ms and tip angle $\theta=90°$. Experimental values were obtained by measuring magnitude as a function of resonance offset for lightly doped HDO (illustrated by the symbol +).

In an alternate embodiment of the invention, as illustrated in FIG. 1, the monostable timer may be eliminated such that the gate signal is fed directly into the filter network. Filter network 30 removes selective frequencies from the frequency content of the gate signal. Therefore, a modulating signal having its amplitude varying as function of time is generated at the output of filter network 30. This modulating signal is used to modulate the amplitude and the carrier frequency signal pulse as previously discussed.

The present invention has distinct advantages over the prior art. First, all of the components needed to add the present invention to a standard Fourier transform NMR spectrometer are inexpensive and readily available. Second, no computer programming is required such that it is easy to change from one type of excitation to another type by simply adjusting the filter network. Third, the filters can easily be adjusted by feeding the modulating pulse or pulses directly into the data acquisition port of a spectrometer and using the Fourier transform capabilities of the spectrometer to verify the nature of the audio signal prior to mixing it with the rf signal. A fourth and major advantage of the present invention involves the phase characteristics of the rf pulses that are generated. Many of the previously used tailored pulses, including the soft pulse and the Dante pulse, have extremely poor phase characteristics especially when they are used to apply 90° or 180° pulses. As discussed herein, the pulses generated by the present invention have extremely desirable phase characteristics.

The previous description of the preferred embodiments are provided to enable any persons skilled in the art to make or use the present invention. Various modifications to these embodiments will be readily apparent to those skilled in the art and the generic principles defined herein may be applied to other embodiments without the use of the inventive faculty. Thus, the present invention is not intended to be limited to the embodiment shown herein but is to be afforded the widest scope consistent with the principles and novel features disclosed herein.

What is claimed is:

1. An apparatus for generating a frequency selective output pulse from a carrier frequency signal pulse of a predetermined duration, comprising:

pulse means for generating at least one modulating pulse of predetermined amplitude, duration, and frequency content;

filter means responsive to said modulating pulse for removing selected frequencies from the frequency content of said modulating pulse, said filter means having a predetermined transfer function so as to provide a modulating signal varying in amplitude as a function of time as determined by a filter impulse response; and modulator means for receiving a carrier frequency signal pulse, said carrier frequency signal pulse being of a predetermined duration and a single constant carrier frequency, and responsive to said modulating signal for modulating the amplitude of the carrier frequency signal pulse and providing a frequency selective output pulse having a predetermined frequency content centered about the carrier frequency of the carrier frequency signal pulse.

2. The apparatus of claim 1 wherein said filter means comprises at least one filter having a predetermined transfer function.

3. The apparatus of claim 1 wherein said filter means comprises:
a plurality of filters each having a predetermined transfer function; and
means for coupling selected ones of said plurality of filters in a predetermined arrangement.

4. The apparatus of claim 1 wherein said modulator means comprises a linear amplitude modulator circuit having a signal input for receiving the carrier frequency signal pulse, a modulation input for receiving said modulating signal, and an output for providing said frequency selective pulse.

5. The apparatus of claim 1 wherein said pulse means comprises a monostable multivibrator circuit having an input for receiving a gate signal and an output for providing at least one modulating pulse.

6. The apparatus of claim 1 further comprising:
first gain means responsive to the carrier frequency signal pulse for controlling the amplitude carrier frequency signal pulse provided to said modulator means; and second gain means responsive to the frequency selective output pulse for controlling the amplitude of the frequency selective output pulse.

7. The apparatus of claim 1 further comprising switch means for receiving said modulating signal and for selectively providing at least one of said modulating signal and a constant amplitude control signal to said modulator means for respectively amplitude modulating the carrier frequency signal pulse with a time varying function and a constant function.

8. The apparatus of claim 1 further comprising switch means coupled between the input and output of said modulator means for selectively bypassing the carrier frequency signal pulse from said modulator means.

9. In a NMR spectrometer providing an rf carrier frequency signal pulse having constant amplitude during a variable time duration, T, in response to a gate signal, an apparatus for generating a frequency selective output pulse from the single carrier frequency signal pulse, comprising:
  pulse means responsive to the gate signal for generating at least one modulating pulse of predetermined amplitude, time duration ($t_a$), and broadband low-frequency content;
  filter means responsive to said modulating pulse for removing selected frequencies within the low-frequency bandwidth from the frequency content of said modulating pulse, said filter means having a predetermined transfer function so as to provide a modulating signal varying in amplitude as a function of time; and
  modulator means responsive to an rf carrier frequency signal pulse and said modulating signal for modulating the amplitude of said rf carrier frequency signal pulse during the time duration T, and providing a frequency selective output pulse having a predetermined frequency content centered about the rf carrier frequency of the rf carrier frequency signal pulse.

10. The apparatus of claim 9 further comprising:
  first gain means responsive to the rf carrier frequency signal pulse for controlling the amplitude of the rf carrier signal pulse provided to said modulator means; and
  second gain means responsive to the frequency selective output pulse for controlling the amplitude of the frequency selective output pulse.

11. The apparatus of claim 10 further comprising switch means coupled between the output of said filter means and a modulation input of said modulator means for selectively providing at least one of said modulating signal and a constant amplitude control signal to said modulator means modulation input for respectively amplitude modulating the rf carrier frequency signal pulse with a time varying function and a constant function.

12. The apparatus of claim 10 further comprising switch means coupled between the input and output of said modulator means for selectively bypassing the rf carrier frequency signal pulse about said modulator means.

13. A method of generating a frequency selective output pulse from a carrier frequency signal pulse of a predetermined duration, comprising:
  providing a modulating signal varying in amplitude as a function of time; and
  providing a frequency selective output pulse having a predetermined frequency content centered about a constant single carrier frequency of a carrier frequency signal pulse by modulating the amplitude of the carrier frequency signal pulse with said modulating signal.

14. The method of claim 13 further comprising the step of generating at least one modulating pulse of a predetermined amplitude, duration, and frequency content; and wherein said modulating signal varies in amplitude as a function of time by removing selected frequencies from said modulating pulse.

15. The method of claim 13 wherein the varying amplitude of said modulating amplitude of said modulating signal is determined by a filter impulse response.

16. The method of claim 13 wherein the step of providing a modulating signal comprises selectively coupling a plurality of filters in a predetermined arrangement.

17. The method of claim 13 further comprising the steps of:
  controlling the amplitude of the carrier frequency signal pulse; and
  controlling the amplitude of the frequency selective output pulse.

18. An apparatus for generating a frequency selective output pulse from a carrier frequency signal pulse of a predetermined duration and a gate signal, comprising:
  filter means responsive to a gate signal for removing selected frequencies from the frequency content of the gate signal, said filter means having a predetermined transfer function so as to provide a modulating signal varying in amplitude as a function of time; and
  modulator means for receiving a carrier frequency signal pulse, said carrier frequency signal pulse being of a predetermined duration and a single constant carrier frequency, and responsive to aid modulating signal for modulating the amplitude of the carrier frequency signal pulse and providing a frequency selective output pulse having a predetermined frequency content centered about the carrier frequency of the carrier frequency signal pulse.

19. An apparatus for generating a frequency selective output pulse from a carrier frequency signal pulse of a predetermined duration, comprising:
  pulse means for generating at least one modulating pulse of predetermined amplitude, duration, and frequency content;
  filter means responsive to said modulating pulse for removing selected frequencies from the frequency content of said modulating pulse, said filter means having a predetermined transfer function so as to provide a modulating signal varying in amplitude as a function of time; and
  modulator means for receiving a carrier frequency signal pulse and responsive to said modulating signal for modulating the amplitude of the carrier frequency signal pulse and providing a frequency selective output pulse having a predetermined frequency content centered about the carrier frequency of the carrier frequency signal pulse, said modulator means comprising a linear amplitude modulator circuit having a signal input for receiving the carrier frequency signal pulse, a modulation input for receiving said modulation signal, and an output for providing said frequency selective pulse.

20. The apparatus of claim 19 wherein said filter means comprises at least one filter having a predetermined transfer function.

21. The apparatus of claim 19 wherein said filter means comprises:
a plurality of filters each having a predetermined transfer function; and
means for coupling selected ones of said plurality of filters in a predetermined arrangement.

22. The apparatus of claim 19 wherein said pulse means comprises a monostable multivibrator circuit having an input for receiving a gate signal and output for providing at least one modulating pulse.

23. An apparatus for generating a frequency selective output pulse from a carrier frequency signal pulse of a predetermined duration, comprising:
pulse means for generating at least one modulating pulse of predetermined amplitude, duration, and frequency content;
filter means responsive to said modulating pulse for removing selected frequencies from the frequency content of said modulating pulse, said filter means having a predetermined transfer function so as to provide a modulating signal varying in amplitude as a function of time;
modulator means for receiving a carrier frequency signal pulse and responsive to said modulating signal for modulating the amplitude of the carrier frequency signal pulse and providing a frequency selective output pulse having a predetermined frequency content centered about the carrier frequency of the carrier frequency signal pulse;
first gain means reponsive to the carrier frequency signal pulse for controlling the amplitude carrier frequency signal pulse provided to said modulator means; and
second gain means responsive to the frequency selective output pulse for controlling the amplitude of the frequency selective output pulse.

24. An apparatus for generating a frequency selective output pulse from a carrier frequency signal pulse of a predetermined duration, comprising:
pulse means for generating at least one modulating pulse of predetermined amplitude, duration, and frequency content;
filter means responsive to said modulating pulse for removing selected frequencies from the frequency content of said modulating pulse, said filter means having a predetermined transfer function so as to provide a modulating signal varying in amplitude as a function of time; and
modulator means for receiving a carrier frequency signal pulse and responsive to said modulating signal for modulating the amplitude of the carrier frequency signal pulse and providing a frequency selective output pulse having a predetermined frequency content centered about the carrier frequency of the carrier frequency signal pulse; and
switch means for receiving said modulating signal and for selectively providing at least one modulating signal and a constant amplitude control signal to said modulator means for respectively amplitude modulating the carrier frequency signal pulse with a time varying function and a constant function.

25. An apparatus for generating a frequency selective output pulse from a carrier frequency signal pulse of a predetermined duration, comprising:
pulse means for generating at least one modulating pulse of predetermined amplitude, duration, and frequency content;
filter means responsive to said modulating pulse for removing selected frequencies from the frequency content of said modulating pulse, said filter means having a predetermined transfer function so as to provide a modulating signal varying in amplitude as a function of time; and
modulator means for receiving a carrier frequency signal pulse and responsive to said modulating signal for modulating the amplitude of the carrier frequency signal pulse and providing a frequency selective output pulse having a predetermined frequency content centered about the carrier frequency of the carrier frequency signal pulse; and
switch means coupled between the input and output of said modulator means for selectively bypassing the carrier frequency signal pulse from said modulator means.

26. A method of generating a frequency selective output pulse from a carrier frequency signal pulse of a predetermined duration, comprising:
providing a modulating signal varying in amplitude as a function of time; and
providing a frequency selective output pulse having a predetermined frequency content centered about a carrier frequency in a carrier frequency signal pulse by modulating the amplitude of the carrier frequency signal pulse with said modulating signal wherein the varying amplitude of said modulating amplitude of said modulating signal is determined by a filter impulse response.

27. The method of claim 26 further comprising the step of generating at least one modulating pulse of a predetermined amplitude, duration, and frequency content; and wherein said modulating signal varies in amplitude as a function of time by removing selected frequencies from said modulating pulse.

28. The method of claim 26 wherein the step of providing a modulating signal comprises selectively coupling a plurality of filters in a predetermined arrangement.

29. The method of claim 26 further comprising the steps of:
controlling the amplitude of the carrier frequency signal pulse; and
controlling the amplitude of the frequency selective output pulse.

* * * * *

UNITED STATES PATENT AND TRADEMARK OFFICE
CERTIFICATE OF CORRECTION

PATENT NO. : 4,695,798
DATED : September 22, 1987
INVENTOR(S) : Rolf Brandes

It is certified that error appears in the above-identified patent and that said Letters Patent is hereby corrected as shown below:

Column 14, claim 18, line 36 "aid" should read --said--.

Signed and Sealed this

Nineteenth Day of April, 1988

Attest:

DONALD J. QUIGG

*Attesting Officer*    *Commissioner of Patents and Trademarks*